(12) United States Patent
Yoshii et al.

(10) Patent No.: US 7,755,395 B2
(45) Date of Patent: Jul. 13, 2010

(54) INVERTER CIRCUIT

(75) Inventors: Kohji Yoshii, Hyogo (JP); Yasutaka Shimizu, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/492,873

(22) Filed: Jun. 26, 2009

(65) Prior Publication Data

US 2010/0013519 A1      Jan. 21, 2010

(30) Foreign Application Priority Data

Jul. 17, 2008 (JP) .............................. 2008-185956

(51) Int. Cl.
*H03K 19/0944* (2006.01)

(52) U.S. Cl. .................. 326/83; 326/119; 326/115; 327/534

(58) Field of Classification Search .................. 326/82, 326/83, 112, 115, 119; 327/108, 109, 534
See application file for complete search history.

(56) References Cited

U.S. PATENT DOCUMENTS 4,418,292 A * 11/1983 Cserhalmi et al. ............. 326/23
6,229,405 B1 * 5/2001 Hashimoto ............ 331/116 FE

FOREIGN PATENT DOCUMENTS

| JP | 59-121939 | 8/1984 |
|---|---|---|
| JP | 1-99317 | 4/1989 |
| JP | 1-276920 | 11/1989 |
| JP | 1-300616 | 12/1989 |
| JP | 4-273716 | 9/1992 |
| JP | 2003-101403 | 4/2003 |
| JP | 2004-70827 | 3/2004 |
| JP | 2004-112156 | 4/2004 |
| JP | 2006-147845 | 6/2006 |
| JP | 2006-148515 | 6/2006 |

* cited by examiner

*Primary Examiner*—Daniel D Chang
(74) *Attorney, Agent, or Firm*—Cooper & Dunham LLP

(57) ABSTRACT

An inverter circuit for generating an output signal at an output node obtained by inverting an input signal level at an input node includes a common-source MOS transistor having a gate node connected to the input node, a source connected to a predetermined voltage and a substrate gate, a load resistor connected in series with the MOS transistor, and a resistor connected between the gate node and the substrate gate of the MOS transistor.

4 Claims, 3 Drawing Sheets

INVERTER CIRCUIT

BACKGROUND OF THE INVENTION

1. Field of the Invention

The present invention generally relates to an inverter circuit, and specifically to an inverter circuit capable of lowering a threshold input voltage and reducing leakage current.

2. Description of the Related Art

Recent environmental measures require energy conservation, and a technology in low-voltage operation has progressed for the purpose of achieving conservation of power in electronic circuits. In order to lower a power supply voltage of the electronic circuit, it is desirable to lower a threshold voltage of a MOS transistor used therein. However, if the threshold voltage is lowered, leakage current of the circuit increases when the MOS transistor is turned off, thereby increasing current consumption. Further, if the threshold voltage is increased, the switching rate of the MOS transistor is decreased.

In some types of signals utilized for the low-voltage operation technology, a signal level is determined based on a voltage differing from that of a typical level. In such cases, a threshold voltage is controlled based on a substrate bias effect of a MOS transistor. That is, the voltage applied to a substrate gate (or back gate) of the MOS transistor is controlled to vary between when the MOS transistor is switching and when the MOS transistor stops switching. Specifically, the threshold voltage of the MOS transistor is lowered to increase rates of switching during a switching operation, and the threshold voltage thereof is increased to reduce leakage current when the switching operation is stopped.

FIG. 6 is a diagram illustrating a circuit example of an inverter circuit according to a related art (see Japanese Laid-Open Patent Application, No. 2006-147845).

An inverter circuit 100 in FIG. 6 includes a PMOS transistor P101, an NMOS transistor N101, a resistor R101, a capacitor C101, an output node OUT and a load CL, in which the output node OUT is connected to the load CL.

In FIG. 6, when a voltage input to an input node IN is at a low level or a ground voltage Vss, the PMOS transistor P101 is turned on while the NMOS transistor N101 is turned off, thereby switching the voltage applied to the output node OUT to a high level.

In this state, since the voltages at both ends of the capacitor C101 are at the low level, electric charge is not accumulated in the capacitor C101, and a substrate gate of the NMOS transistor N101 is at the ground voltage Vss. Therefore, since the threshold voltage of the NMOS transistor N101 is high, the amount of the leakage current of the NMOS transistor N101 is small, thereby reducing current consumption of the inverter circuit 100.

When the input voltage is switched from the low level to the high level or from the ground voltage Vss to a power supply voltage Vdd, the PMOS transistor P101 is turned off while the NMOS transistor N101 is turned on, thereby switching the voltage of the output node OUT to the low level.

Since the voltage at one end of the capacitor C101 to which the input node IN is connected is switched to the high level, the capacitor C101 is charged by the application of the input voltage. Since the charged current in the capacitor C101 flows into the resistor R101, a voltage drop occurs in the resistor R101, thereby increasing the voltage at the substrate gate of the NMOS transistor N101. When the voltage of the substrate gate rises, the threshold voltage of the NMOS transistor N101 lowers due to a substrate bias effect of the NMOS transistor N101.

Thus, the NMOS transistor N101 is turned on by the application of only a small input voltage to carry out a high-rate operation.

The charging of the capacitor C101 will end when a predetermined time has elapsed since the input voltage has been switched to the high level. Since one end of the capacitor C101 in this state has a voltage the same as the input voltage at the high level, the charged current therein will not flow into the resistor R101. No voltage drop thus occurs in the resistor R101, and hence, the voltage at the substrate gate of the NMOS transistor N101 is switched to the ground voltage Vss.

When the input voltage is switched from the high level to the low level, the PMOS transistor P101 is turned on while the NMOS transistor N101 is turned off, thereby switching the voltage at the output node OUT to the high level.

Since the voltage at the one end of the capacitor C101 to which the input node IN is connected is switched to the low level, the capacitor C101 is discharged in a direction towards the input node IN. Since the current discharged from the capacitor C101 flows into the resistor R101, the voltage drop occurs in the resistor R101, thereby lowering the voltage of the substrate gate of the NMOS transistor N101 to a negative level.

When the voltage of the substrate gate lowers, the threshold voltage of the NMOS transistor N101 rises due to the substrate bias effect. However, since a time at which the voltage of the output node OUT is switched from the low level to the high level is determined based on the threshold voltage of the PMOS transistor P101, the time at which the voltage of the output node OUT is switched from the low level to the high level is almost the same as that of a typical CMOS inverter circuit.

Note that when a predetermined time has elapsed since the input voltage has been switched to the low level, discharge of the capacitor C101 will end and the voltage at the substrate gate of the NMOS transistor N101 is switched to the ground voltage Vss. Accordingly, the amount of the leakage current of the NMOS transistor N101 can be maintained almost the same as that of the typical inverter circuit.

Thus, in the inverter circuit in FIG. 6, high rates of operation can be achieved by lowering the threshold voltage of the NMOS transistor N101 when the voltage of the input node IN is switched from the low level to the high level, and an increase in the leakage current can be prevented by maintaining the voltage at the substrate gate of the NMOS transistor N101 to the ground voltage Vss when the NMOS transistor N101 is turned off.

Note that as similar to the circuit configuration in FIG. 6, there is disclosed a circuit configuration in which high rates of operation can be achieved by changing the threshold voltage of the PMOS transistor P101 when the voltage of the input node IN is switched from the high level to the low level. In addition, there is also disclosed a circuit configuration in which high rates of operation can be achieved both at voltage rise time and voltage fall time of the input node IN by changing the threshold voltage of the NMOS transistor N101 when the voltage of the input node IN is switched from the low level to the high level and changing the threshold voltage of the PMOS transistor P101 when the voltage of the input node IN is switched from the high level to the low level.

However, in the inverter circuit in FIG. 6, since the voltage of the substrate gate is suppressed via the capacitor C101 connected between the input node IN and the substrate gate, the threshold voltage can be changed only when a signal rise-up or fall time exhibits a dramatic change.

Further, as shown in FIG. 6, when the inverter circuit is formed on a semiconductor chip of a silicon substrate, a parasitic diode (not shown) is formed between the substrate gate and a source of the NMOS transistor N101. An anode of the parasitic diode is located at a side of the substrate gate of the NMOS transistor N101 and a cathode thereof is located at a side of the source thereof. In the inverter circuit having the parasitic diode connected therein, when the input voltage is switched from the low level to the high level, the voltage of the substrate gate of the NMOS transistor N101 is clamped to a forward voltage of the parasitic diode. Therefore, when the input voltage exceeds the forward voltage of the parasitic diode, the input voltage charges the capacitor C101, thereby undesirably causing a large amount of current to flow into the inverter circuit to lower input impedance. In addition, since more capacitors C101 may need installing, chip areas will undesirably be increased.

SUMMARY OF THE INVENTION

Accordingly, embodiments of the present invention may provide a novel and useful inverter circuit solving one or more of the problems discussed above. More specifically, the embodiments of the present invention may provide an inverter circuit capable of lowering a threshold voltage when an input voltage changes in a gradual manner, preventing input impedance from decreasing, and suppressing an increase in chip areas.

An inverter circuit for generating an output signal at an output node obtained by inverting an input signal level at an input node according to an embodiment of the invention includes a common-source MOS transistor having a gate node connected to the input node, a source connected to a predetermined voltage and a substrate gate, a load resistor connected in series with the MOS transistor, and a resistor connected between the gate node and the substrate gate of the MOS transistor.

An inverter circuit a CMOS configuration for generating an output signal at an output node obtained by inverting an input signal level at an input node according to an embodiment of the invention includes a PMOS transistor having a gate node connected to the input node, a source connected to a positive power supply voltage and a drain, an NMOS transistor having a gate node connected to the input node, a source connected to a negative power supply voltage, a drain and a substrate gate, a load resistor connected between the drains of the PMOS transistor and the NMOS transistor, and a resistor connected between the gate node and the substrate gate of the NMOS transistor.

An inverter circuit a CMOS configuration for generating an output signal at an output node obtained by inverting an input signal level at an input node according to another embodiment of the invention includes a PMOS transistor having a gate node connected to the input node, a source connected to a positive power supply voltage, a drain and a substrate gate, an NMOS transistor having a gate node connected to the input node, a source connected to a negative power supply voltage and a drain, a load resistor connected between the drains of the PMOS transistor and the NMOS transistor, and a resistor connected between the gate node and the substrate gate of the PMOS transistor.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DETAILED DESCRIPTION OF THE PREFERRED EMBODIMENTS

A description is given below, with reference to FIGS. 1 through 5 of embodiments of the present invention.

First Embodiment

Figure 1:
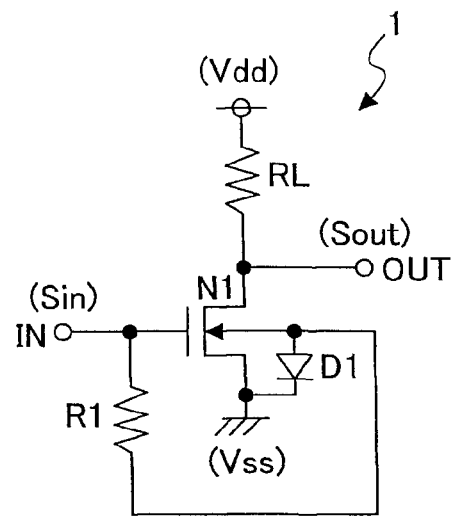
FIG. 1 is a diagram illustrating a circuit example of an inverter circuit according to a first embodiment of the invention.

FIG. 1 is a diagram illustrating a circuit example of an inverter circuit according to a first embodiment of the invention. The inverter circuit 1 in FIG. 1 includes an NMOS transistor N1, a load resistor RL, and a resistor R1, and is configured to generate a signal having an inverted signal level at an output node as an output signal Sout based on a signal level of an input signal Sin at an input node. Note that in FIG. 1, a diode D1 connected between a substrate gate and a source of the NMOS transistor N1 is a parasitic diode that is formed when the NMOS transistor N1 is formed on a semiconductor chip.

A gate and a source of the NMOS transistor N1 are respectively connected to the input node IN of the inverter circuit 1 and a ground voltage Vss. A drain of the NMOS transistor N1 is connected to a power supply voltage Vdd via the load resistor RL. The resistor R1 is connected between the gate and the substrate gate of the NMOS transistor N1. A joint point between the load resistor RL and the NMOS transistor N1 is connected to the output node OUT of the inverter circuit 1.

In the inverter circuit having this configuration, when the input signal Sin is at a low level, that is, the ground voltage Vss, the NMOS transistor N1 is turned off to stay in a cut-off mode. The output signal Sout is thus switched to the high level, that is, the power supply voltage Vdd. The substrate gate of the NMOS transistor N1 in this state has a low-level voltage the same as the voltage level of the input signal Sin, and thus has approximately the ground voltage Vss. Accordingly, since the threshold voltage of the NMOS transistor N1 is large, the amount of the leakage current of the NMOS transistor N1 is small, thereby reducing the current consumption of the inverter circuit 1.

When the voltage of the input signal Sin rises, the voltage of the substrate gate of the NMOS transistor N1 also rises, thereby lowering the threshold voltage of the NMOS transistor N1 due to the substrate bias effect. When the voltage of the input signal Sin reaches the threshold voltage of the NMOS transistor N1, the NMOS transistor N1 is turned on to switch the output signal Sout to the low level. The threshold voltage of the NMOS transistor N1 in this state is lower than that obtained when the input signal Sin is at the low level.

Note that when the voltage of the input signal Sin equals or exceeds a forward voltage of the parasitic diode D1, current flows into the ground voltage Vss from the input node IN via the resistor R1 and the parasitic diode D1, and hence the voltage of the substrate gate of the NMOS transistor N1 is clamped to the forward voltage of the parasitic diode D1. However, if the resistance value of the resistor R1 is adjusted to a large value such as several mega-ohms, a decrease in input impedance in the inverter circuit 1 can be suppressed.

Since the input node IN and the substrate gate of the NMOS transistor N1 are DC coupled via the resistor R1, the voltage of the substrate gate of the NMOS transistor N1 will be independent of a rise rate of the voltage of the input signal Sin. In addition, when the input signal Sin is at the high level, the threshold voltage of the NMOS transistor N1 stays low. However, since the NMOS transistor N1 is still turned on, the amount of the leakage current is not an issue.

Further, a small amount of current may flow into the ground voltage Vss from the input node IN via the resistor R1 and the parasitic diode D1. However, the resistance value of the resistor R1 can be increased so as to suppress an increase in current consumption. An electronic circuit utilizing the inverter circuit 1 is designed such that the inverter circuit 1 is always switched to the low level when standby mode so as to suppress the increase in current consumption.

When the input signal Sin is switched from the high level to the low level, the NMOS transistor N1 is turned off and the voltage of the output node OUT is switched to the high level. Since the substrate gate of the NMOS transistor N1 is also switched to the low level, the threshold voltage of the NMOS transistor N1 increases as described above, thereby suppressing the increase in the leakage current.

Figure 2:
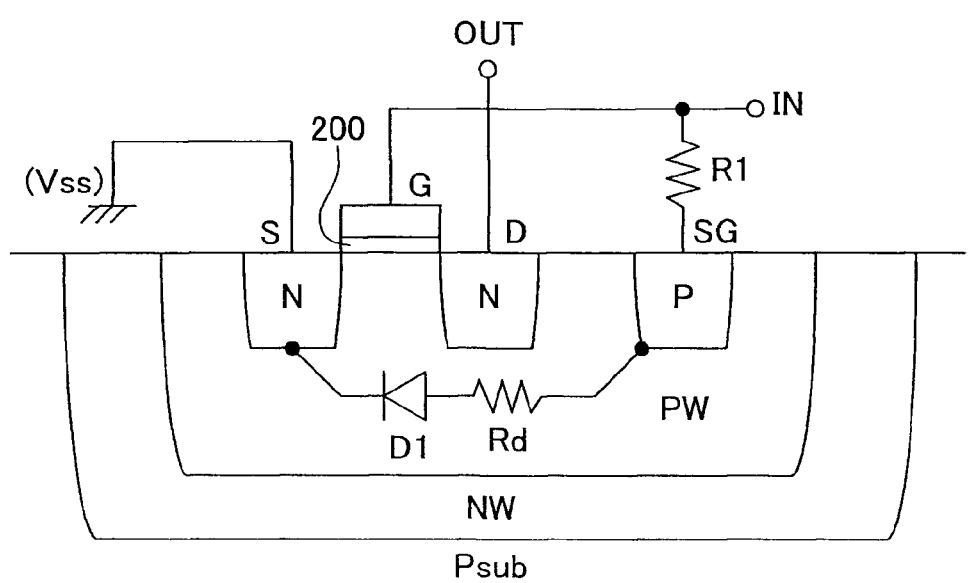
FIG. 2 is a diagram illustrating one example of a device structure of an NMOS transistor N1.

FIG. 2 is a diagram illustrating one example of a device structure of the NMOS transistor N1.

As shown in FIG. 2, the NMOS transistor N1 is formed in a P-well region PW that is formed in an N-well region NW on a substrate Psub.

The P-well region PW includes two N-regions and one P-region. A first N-region forms a source S, a second N-region forms a drain D, and the P-region forms a substrate gate SG. An insulating layer 200 is formed on a surface of a chip between the first N-region of the source S and the second N-region of the drain D, and a gate electrode G is formed on the insulating layer.

An electrode of the substrate gate SG of the NMOS transistor N1 is extended out from the P-region formed in the P-well region PW. As illustrated in FIG. 2, in the NMOS transistor N1, the electrode of the substrate gate SG is arranged on a side of a semiconductor region in which the drain D is formed. Accordingly, since a distance between the substrate gate SG and the N-region of the source S gets longer and on-resistance Rd in a forward direction of the parasitic diode D1 thus gets larger, the voltage of the substrate gate SG can be raised up to a larger voltage and the input impedance can also be increased.

Thus, in the inverter circuit according to the first embodiment, since the input node IN and the substrate gate SG of the NMOS transistor N1 are DC coupled via the resistor R1 having high resistance, the threshold voltage of the NMOS transistor N1 can be changed independently of rise and fall rates of the input signal Sin, the decrease in the input impedance can be suppressed, the increase in the leakage current of the NMOS transistor N1 can be suppressed, the threshold voltage of the NMOS transistor N1 at switching can be lowered, and the increase in the chip areas can be suppressed, with a simple circuit configuration.

Second Embodiment

The inverter circuit according to the first embodiment is configured to include the NMOS transistor; however, a PMOS transistor can be utilized in place of the NMOS transistor. The inverter circuit having such a configuration constitutes a second embodiment of the invention.

Figure 3:
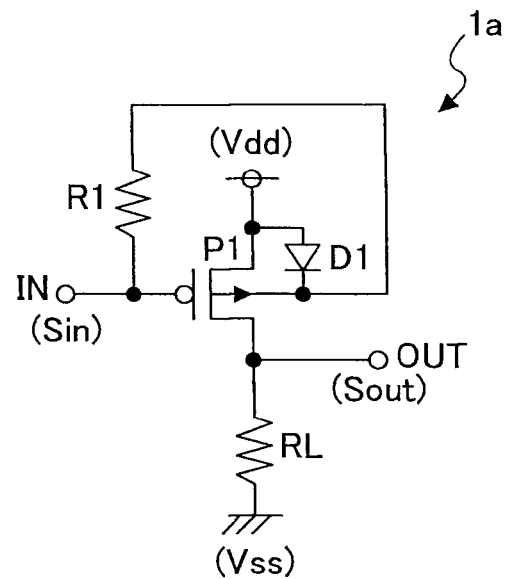
FIG. 3 is a diagram illustrating a circuit example of an inverter circuit according to a second embodiment of the invention.

FIG. 3 is a diagram illustrating a circuit example of an inverter circuit according to the second embodiment of the invention. Note that in FIG. 3, components either identical or similar to those in FIG. 1 are given by the same reference numerals.

The inverter circuit 1a in FIG. 3 includes a PMOS transistor P1, a load resistor RL, and a resistor R1, and is configured to generate a signal having an inverted signal level at an output node as an output signal Sout based on a signal level of an input signal Sin at an input node. Note that in FIG. 3, a diode D1 connected between a substrate gate and a source of the PMOS transistor P1 is a parasitic diode that is formed when the PMOS transistor P1 is formed on the semiconductor chip.

A gate and a source of the PMOS transistor P1 are respectively connected to the input node IN of the inverter circuit 1a and a power supply voltage Vdd. A drain of the PMOS transistor P1 is connected to a ground voltage Vss via the load resistor RL. The resistor R1 is connected between the gate and the substrate gate of the PMOS transistor P1. A joint point between the load resistor RL and the PMOS transistor P1 is connected to the output node OUT of the inverter circuit 1a.

In the inverter circuit 1a having such a configuration, when the input signal Sin is at a high level, the PMOS transistor P1 is turned off to stay in a cut-off mode, thereby switching the output signal Sout to a low level. The substrate gate of the PMOS transistor P1 in this state has a high-level voltage the same as the voltage level of the input signal Sin, and thus has approximately the power supply voltage Vdd. Accordingly, since the threshold voltage of the PMOS transistor P1 is large, the amount of the leakage current of the PMOS transistor P1 is small, thereby reducing current consumption of the inverter circuit 1a.

When the voltage of the input signal Sin lowers, the voltage of the substrate gate of the PMOS transistor P1 also lowers, thereby lowering the threshold voltage of the PMOS transistor P1 due to a substrate bias effect. When the voltage of the input signal Sin reaches the threshold voltage of the PMOS transistor PE, the PMOS transistor P1 is turned on to switch the output signal Sout to the high level. The threshold voltage of the PMOS transistor P1 in this state is lower than that obtained when the input signal Sin is at the high level.

Note that when a difference between the power supply voltage Vdd and the voltage of the input signal Sin equals or exceeds a forward voltage of the parasitic diode D1, current flows into the input node IN from the power supply voltage Vdd via the parasitic diode D1 and the resistor R1, and hence the voltage of the substrate gate of the PMOS transistor P1 is clamped to the forward voltage of the parasitic diode D1. However, if the resistance value of the resistor R1 is adjusted to a large value such as several mega-ohms, a decrease in input impedance in the inverter circuit 1a can be suppressed.

Since the input node IN and the substrate gate of the PMOS transistor P1 are DC coupled via the resistor R1, the voltage of the substrate gate of the PMOS transistor P1 will be independent of a rise rate of the voltage of the input signal Sin.

In addition, when the input signal Sin is at the low level, the threshold voltage of the PMOS transistor P1 stays low, however, since the PMOS transistor P1 is turned on, the amount of the leakage current is not an issue.

Further, a small amount of current may flow into the input node IN from the power supply voltage Vdd via the parasitic diode D1 and the resistor R1. However, the resistance value of the resistor R1 can be increased so as to suppress an increase in current consumption. An electronic circuit utilizing the inverter circuit 1a is designed such that the inverter circuit 1a is always switched to the low level when standby mode so as to suppress the increase in current consumption.

When the input signal Sin is switched from the low level to the high level, the PMOS transistor P1 is turned off and the voltage of the output node OUT is switched to the low level. Since the substrate gate of the PMOS transistor P1 is also switched to the high level, the threshold voltage of the PMOS transistor P1 increases as described above, thereby suppressing the increase in the leakage current.

Note that in the PMOS transistor P1 of the inverter circuit 1a according to the second embodiment, the region from which the substrate gate of the PMOS transistor P1 is obtained is provided on the drain side thereof as similar to the NMOS transistor N1 shown in FIG. 2 of the inverter circuit 1 according to the first embodiment. As a result, a similar effect can be obtained as that obtained in the NMOS transistor N1 of the inverter circuit 1 according to the first embodiment.

Thus, in the inverter circuit 1a according to the second embodiment, since the input node IN and the substrate gate of the PMOS transistor P1 are DC coupled via the resistor R1 having high resistance, the threshold voltage of the PMOS transistor P1 can be changed independently of rise and fall rates of the input signal Sin. As a result, the decrease in the input impedance can be suppressed, the increase in the leakage current of the PMOS transistor P1 can also be suppressed, the threshold voltage of the PMOS transistor P1 at switching can be lowered, and the increase in the chip areas can be suppressed with a simple circuit configuration.

Third Embodiment

Figure 4:
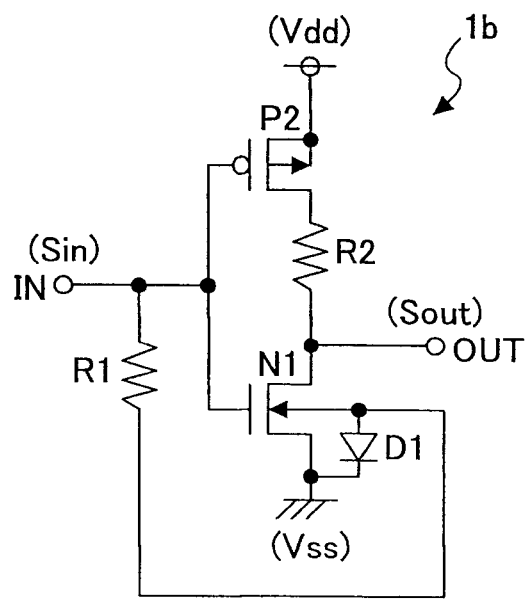
FIG. 4 is a diagram illustrating a circuit example of an inverter circuit according to a third embodiment of the invention.

The inverter circuit according to the first embodiment is configured to include the NMOS transistor; however, the inverter circuit of the first embodiment may be formed with a CMOS configuration. The inverter circuit having such a configuration constitutes a third embodiment of the invention. FIG. 4 is a diagram illustrating a circuit example of an inverter circuit according to the third embodiment of the invention. Note that in FIG. 4, components either identical or similar to those in FIG. 1 are given by the same reference numerals.

An inverter circuit 1b in FIG. 4 includes an NMOS transistor N1, a PMOS transistor P2, and resistors R1, R2 and is configured to generate a signal having an inverted signal level at an output node as an output signal Sout based on a signal level of an input signal Sin at an input node. Note that in FIG. 4, a diode D1 is a parasitic diode that is formed when the NMOS transistor N1 is formed on the semiconductor chip, and the resistor R2 is a load resistor.

Gates of the PMOS transistor P2 and the NMOS transistor N1 are connected, and a joint point is connected to the input node IN. A source of the PMOS transistor P2 is connected to a power supply voltage Vdd and a drain thereof is connected to a drain of the NMOS transistor N1 via the resistor R2. A source of the NMOS transistor N1 is connected to a ground voltage Vss and the drain thereof is connected to the output node OUT of the inverter circuit 1b. The resistor R1 is connected between the input node IN and the substrate gate of the NMOS transistor N1.

Note that the resistor R2 is utilized for lowering the through-current generated when the PMOS transistor P2 and the NMOS transistor N1 are simultaneously turned on, and the output node OUT of the inverter circuit 1b may be connected to one of both ends of the resistor 2. The resistor R2 may include two resistors, and the joint point between the two resistors may be connected to the output node OUT.

In the inverter circuit having such a configuration, when the input signal Sin is at the low level, the NMOS transistor N1 is turned off while the PMOS transistor P2 is turned on, thereby switching the output signal Sout to the high level. The substrate gate of the NMOS transistor N1 in this state has a low-level voltage the same as the voltage level of the input signal Sin, and thus has approximately the ground voltage Vss. Therefore, since the threshold voltage of the NMOS transistor N1 is large, the amount of the leakage current of the NMOS transistor N1 is small, thereby reducing current consumption of the inverter circuit 1b.

When the voltage of the input signal Sin rises, the voltage of the substrate gate of the NMOS transistor N1 also rises, thereby lowering the threshold voltage of the NMOS transistor N1 due to a substrate bias effect. When the voltage of the input signal Sin reaches the threshold voltage of the NMOS transistor N1, the NMOS transistor N1 is turned on to switch the output signal Sout to the low level. The threshold voltage of the NMOS transistor N1 in this state is lower than that obtained when the input signal Sin is at the low level.

Note that when the voltage of the input signal Sin equals or exceeds a forward voltage of the parasitic diode D1 as similar to the first embodiment, current flows into the ground voltage Vss from the input node IN via the resistor R1 and the parasitic diode D1. Thus, the voltage of the substrate gate of the NMOS transistor N1 is clamped to the forward voltage of the parasitic diode. However, if the resistance value of the resistor R1 is adjusted to a large value such as several mega-ohms, a decrease in input impedance in the inverter circuit 1b can be suppressed.

Further, since the input node IN and the substrate gate of the NMOS transistor N1 are DC coupled via the resistor R1, the voltage of the substrate gate of the NMOS transistor N1 will be independent of a rise rate of the voltage of the input signal Sin. When the input signal Sin is at the high level, the PMOS transistor P2 is turned off while the NMOS transistor N1 is turned on. The threshold voltage of the NMOS transistor N1 in this state stays low. However, since the NMOS transistor N1 is turned on, the amount of the leakage current is not an issue.

Further, a small amount of current may flow into the ground voltage Vss from the input node IN via the resistor R1 and the parasitic diode D1 as similar to the first embodiment. However, the resistance value of the resistor R1 can be increased so as to suppress an increase in current consumption. An electronic circuit utilizing the inverter circuit 1b is designed such that the inverter circuit 1b is always switched to the low level when standby mode so as to suppress the increase in current consumption.

When the input voltage is switched from the high level to the low level, the PMOS transistor P1 is turned on while the NMOS transistor N1 is turned off, thereby switching the voltage of the output node OUT to the high level. Since the substrate gate of the NMOS transistor N1 is also switched to the low level, the threshold voltage of the NMOS transistor N1 increases as described above, thereby suppressing the increase in the leakage current.

Thus, since the inverter circuit of the third embodiment is formed with the inverter circuit of the first embodiment with a CMOS configuration, a similar effect can be obtained as that obtained in the inverter circuit according to the first embodiment.

Fourth Embodiment

The inverter circuit according to the second embodiment is configured to include the PMOS transistor; however, the inverter circuit of the second embodiment may be formed with a CMOS configuration. The inverter circuit having such a configuration constitutes a fourth embodiment of the invention.

Figure 5:
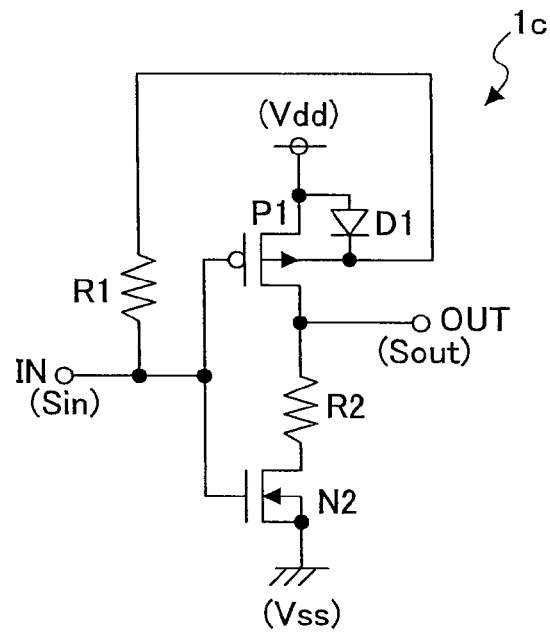
FIG. 5 is a diagram illustrating a circuit example of an inverter circuit according to a fourth embodiment of the invention.
Figure 6:
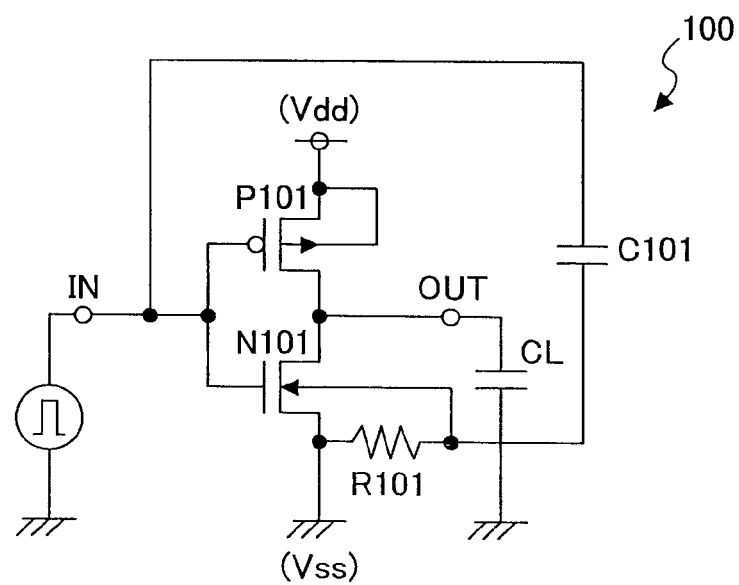
FIG. 6 is a diagram illustrating a circuit example of an inverter circuit according to a related art.

FIG. 5 is a diagram illustrating a circuit example of an inverter circuit according to the fourth embodiment of the invention. Note that in FIG. 5, components either identical or similar to those in FIG. 3 are given by the same reference numerals.

An inverter circuit 1c in FIG. 5 includes an NMOS transistor N2, a PMOS transistor P1, and resistors R1, R2, and is configured to generate a signal having an inverted signal level at an output node as an output signal Sout based on a signal level of an input signal Sin at an input node. Note that in FIG. 5, a diode D1 is a parasitic diode that is formed when the PMOS transistor P1 is formed on the semiconductor chip, and the resistor R2 is a load resistor.

Gates of the PMOS transistor P1 and the NMOS transistor N2 are connected, and a joint point is connected to the input node IN. A source of the PMOS transistor P1 is connected to a power supply voltage Vdd and a drain thereof is connected to the output node OUT and also to a drain of the NMOS transistor N2 via the resistor R2. A source of the NMOS transistor N2 is connected to a ground voltage Vss. The resistor R1 is connected between the input node IN and the substrate gate of the PMOS transistor P1.

Note that the resistor R2 is configured for lowering the through-current generated when the PMOS transistor P1 and the NMOS transistor N2 are simultaneously turned on, and the output node OUT of the inverter circuit 1c may be connected to one of both ends of the resistor R2. The resistor R2 may include two resistors, and the joint point between the two resistors may be connected to the output node OUT.

In the inverter circuit having such a configuration, when the input signal Sin is at the high level, the PMOS transistor P1 is turned off while the NMOS transistor N2 is turned on, thereby switching the output signal Sout to the low level. The substrate gate of the PMOS transistor P1 in this state has a high-level voltage the same as the voltage level of the input signal Sin and thus has approximately the power supply voltage Vdd. Accordingly, since the threshold voltage of the PMOS transistor P1 is large, the amount of the leakage current of the PMOS transistor P1 is small, thereby reducing current consumption of the inverter circuit 1c.

When the voltage of the input signal Sin lowers, the voltage of the substrate gate of the PMOS transistor P1 also lowers, thereby lowering the threshold voltage of the PMOS transistor P1 due to a substrate bias effect. When the voltage of the input signal Sin reaches the threshold voltage of the PMOS transistor P1, the PMOS transistor P1 is turned on to switch the output signal Sout to the high level. The threshold voltage of the PMOS transistor P1 in this state is lower than that obtained when the input signal Sin is at the high level.

Note that when a difference between the power supply voltage Vdd and the voltage of the input signal Sin equals or exceeds a forward voltage of the parasitic diode D1 as similar to the second embodiment, current flows into the input node IN from the power supply voltage Vdd via the parasitic diode D1 and the resistor R1. Thus, the voltage of the substrate gate of the PMOS transistor P1 is clamped to the forward voltage of the parasitic diode D1. However, if the resistance value of the resistor R1 is adjusted to a large value such as several mega-ohms, a decrease in input impedance in the inverter circuit 1c can be suppressed.

Since the input node IN and the substrate gate of the PMOS transistor P1 are DC coupled via the resistor R1, the voltage of the substrate gate of the PMOS transistor P1 will be independent of a rise rate of the voltage of the input signal Sin.

When the input signal Sin is at the low level, the NMOS transistor N2 is turned off while the PMOS transistor P1 is turned on. The threshold voltage of the PMOS transistor P1 in this state stays low. However, since the PMOS transistor P1 is turned on, the amount of the leakage current is not an issue.

Further, a small amount of current may flow into the input node IN from the power supply voltage Vdd via the parasitic diode D1 and the resistor RI as similar to the second embodiment. However, the resistance value of the resistor R1 can be increased so as to suppress an increase in current consumption. An electronic circuit utilizing the inverter circuit 1c is designed such that the inverter circuit 1c is always switched to the low level when standby mode so as to suppress the increase in current consumption.

When the input signal Sin is switched from the low level to the high level, the PMOS transistor P1 is turned off and the voltage of the output node OUT is switched to the low level. Since the substrate gate of the PMOS transistor P1 is also switched to the high level, the threshold voltage of the PMOS transistor P1 gets large as described above, thereby suppressing the increase in the leakage current.

Thus, since the inverter circuit of the fourth embodiment is formed with the inverter circuit of the second embodiment with a CMOS configuration, a similar effect can be obtained as that obtained in the inverter circuit according to the second embodiment.

In the inverter circuit according to the embodiments of the invention, since the resistor is connected between the gate and the substrate gate of the MOS transistor the gate of which is connected to the input node, the threshold voltage of the MOS transistor can be changed based on the voltage of the input signal, thereby lowering the threshold voltage of the inverter circuit.

In addition, since the input node and the substrate gate of the MOS transistor are DC coupled, the threshold voltage of the inverter circuit can be lowered even in a case where voltage of the input signal gradually changes.

Further, since the inverter circuit is configured without capacitors, an increase in the chip areas can be suppressed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

This patent application is based on Japanese Priority Patent Application No. 2008-185956 filed on Jul. 17, 2008, the entire contents of which are hereby incorporated herein by reference.

What is claimed is:

1. An inverter circuit for generating an output signal at an output node obtained by inverting an input signal level at an input node, comprising:
   a common-source MOS transistor having a gate node connected to the input node, a source connected to a predetermined voltage, and a substrate gate;
   a load resistor connected in series with the MOS transistor; and
   a resistor connected between the gate node and the substrate gate of the MOS transistor.

2. An inverter circuit a CMOS configuration for generating an output signal at an output node obtained by inverting an input signal level at an input node, comprising:
   a PMOS transistor having a gate node connected to the input node, a source connected to a positive power supply voltage and a drain;
   an NMOS transistor having a gate node connected to the input node, a source connected to a negative power supply voltage, a drain and a substrate gate;
   a load resistor connected between the drains of the PMOS transistor and the NMOS transistor; and
   a resistor connected between the gate node and the substrate gate of the NMOS transistor.

3. An inverter circuit a CMOS configuration for generating an output signal at an output node obtained by inverting an input signal level at an input node, comprising:
   a PMOS transistor having a gate node connected to the input node, a source connected to a positive power supply voltage, a drain and a substrate gate;
   an NMOS transistor having a gate node connected to the input node, a source connected to a negative power supply voltage and a drain;
   a load resistor connected between the drains of the PMOS transistor and the NMOS transistor; and
   a resistor connected between the gate node and the substrate gate of the PMOS transistor.

4. The inverter circuit as claimed in claim 1, wherein the substrate gate includes an electrode arranged in a region distant from the source.

* * * * *